United States Patent
Chen et al.

(10) Patent No.: US 12,048,119 B2
(45) Date of Patent: Jul. 23, 2024

(54) IMMERSION-TYPE LIQUID COOLING HEAT DISSIPATION SINK

(71) Applicant: AMULAIRE THERMAL TECHNOLOGY, INC., New Taipei (TW)

(72) Inventors: Chi-An Chen, New Taipei (TW); Tze-Yang Yeh, New Taipei (TW)

(73) Assignee: AMULAIRE THERMAL TECHNOLOGY, INC., New Taipei (TW)

( * ) Notice: Subject to any disclaimer, the term of this patent is extended or adjusted under 35 U.S.C. 154(b) by 314 days.

(21) Appl. No.: 17/685,388

(22) Filed: Mar. 3, 2022

(65) Prior Publication Data
US 2023/0284417 A1 Sep. 7, 2023

(51) Int. Cl.
| H05K 7/20 | (2006.01) |
| F28F 3/02 | (2006.01) |
| F28F 21/04 | (2006.01) |
| F28F 21/08 | (2006.01) |

(52) U.S. Cl.
CPC ............ *H05K 7/203* (2013.01); *F28F 3/022* (2013.01); *F28F 21/04* (2013.01); *F28F 21/084* (2013.01); *H05K 7/20409* (2013.01)

(58) Field of Classification Search
CPC .................... H05K 7/203; F28F 3/022
See application file for complete search history.

(56) References Cited

U.S. PATENT DOCUMENTS

2017/0280588 A1* 9/2017 Wu .................. H05K 7/20254

OTHER PUBLICATIONS

Effect of surface wettability on boiling and evaporation, Energy, vol. 30, Issues 2-4, 2005, pp. 209-220 (Year: 2005).*
Horizon Technology (Addressing Porosity in Powder Metallurgy, Jun. 27, 2019) (Year: 2019).*

* cited by examiner

*Primary Examiner* — Schyler S Sanks
(74) *Attorney, Agent, or Firm* — Li & Cai Intellectual Property Office

(57) ABSTRACT

An immersion-type liquid cooling heat dissipation sink is provided. The immersion-type liquid cooling heat dissipation sink includes a heat dissipation substrate layer and a surface film layer. The surface film layer is formed on the heat dissipation substrate layer. The heat dissipation substrate layer is a porous substrate that is immersed in an immersion-type coolant. A contact angle between the surface film layer and the immersion-type coolant is less than a contact angle between the heat dissipation substrate layer and the immersion-type coolant. A thickness of the surface film layer is less than an effective thickness of 5 μm.

10 Claims, 6 Drawing Sheets

IMMERSION-TYPE LIQUID COOLING HEAT DISSIPATION SINK

FIELD OF THE DISCLOSURE

The present disclosure relates to a heat dissipation sink, and more particularly to an immersion-type liquid cooling heat dissipation sink.

BACKGROUND OF THE DISCLOSURE

An immersion cooling technology is to directly immerse heat generating elements (such as servers and disk arrays) into a coolant that is non-conductive, and heat generated from operation of the heat producing elements is removed through an endothermic gasification process of the coolant. Therefore, how to dissipate heat more effectively through the immersion cooling technology has long been an issue to be addressed in the industry.

SUMMARY OF THE DISCLOSURE

In response to the above-referenced technical inadequacy, the present disclosure provides an immersion-type liquid cooling heat dissipation sink.

In one aspect, the present disclosure provides an immersion-type liquid cooling heat dissipation sink, which includes a heat dissipation substrate layer and a surface film layer. The surface film layer is formed on the heat dissipation substrate layer. The heat dissipation substrate layer is a porous substrate that is immersed in an immersion-type coolant. A contact angle between the surface film layer and the immersion-type coolant is less than a contact angle between the heat dissipation substrate layer and the immersion-type coolant. A thickness of the surface film layer is less than an effective thickness of 5 μm.

In certain embodiments, the surface film layer is a metal film which covers a surface of the heat dissipation substrate layer but does not fill into every surface hole of the surface of the heat dissipation substrate layer, and the metal film is made of zinc, titanium, tin, silver, stainless steel, or alloys thereof.

In certain embodiments, the surface film layer is a ceramic film which covers a surface of the heat dissipation substrate layer but does not fill into every surface hole of the surface of the heat dissipation substrate layer, and the ceramic film is made of aluminum oxide, silicon oxide, aluminum nitride, or silicon nitride.

In certain embodiments, the heat dissipation substrate layer is made of aluminum, copper, aluminum alloy, or copper alloy.

In certain embodiments, a plurality of fins are integrally formed on a surface of the heat dissipation substrate layer, and each of the plurality of fins is a pin fin, a plate fin, or a composite fin structure formed by a combination of the pin fin and the plate fin.

In certain embodiments, at least one reinforcement structure is further formed on the surface of the heat dissipation substrate layer, and a projection area of the at least one reinforcement structure on the surface of the heat dissipation substrate layer is at least two times larger than a projection area of any one of the plurality of fins on the surface of the heat dissipation substrate layer.

In certain embodiments, the heat dissipation substrate layer has a porosity between 5% and 15%.

In another aspect, the present disclosure provides an immersion-type liquid cooling heat dissipation sink, which includes a heat dissipation substrate layer and a surface film layer. The surface film layer is formed on the heat dissipation substrate layer. The heat dissipation substrate layer is a porous substrate that is integrally formed by metal injection molding and immersed in an immersion-type coolant. A contact angle between the surface film layer and the immersion-type coolant is less than a contact angle between the heat dissipation substrate layer and the immersion-type coolant. A thickness of the surface film layer is less than an effective thickness of 5 μm.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
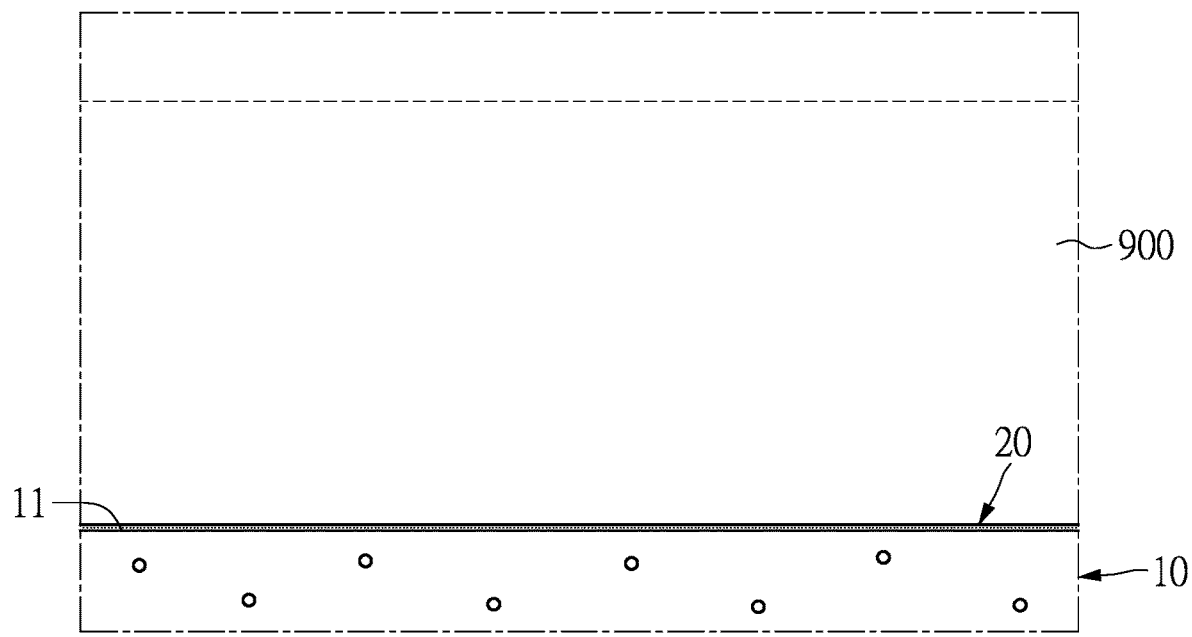
FIG. 1 is a schematic side view of an immersion-type liquid cooling heat dissipation sink according to a first embodiment of the present disclosure.
Figure 2:
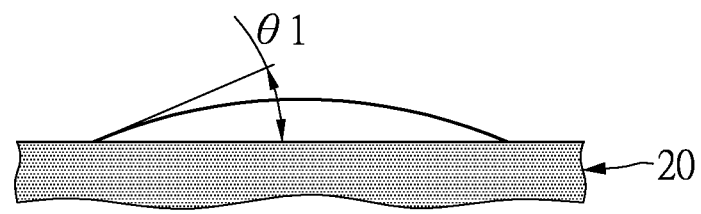
FIG. 2 is a schematic view of a contact angle between a surface film layer and an immersion-type coolant according to the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Reference is made to FIG. 1 to FIG. 4, in which a first embodiment of the present disclosure is shown. Embodiments of the present disclosure provide an immersion-type liquid cooling heat dissipation sink that can be used for contacting a heat generating element. As shown in FIG. 1, the immersion-type liquid cooling heat dissipation sink provided by the embodiments of the present disclosure includes a heat dissipation substrate layer 10 and a surface film layer 20.

In the present embodiment, the heat dissipation substrate layer 10 can be made of a high thermally conductive material, such as aluminum, copper, aluminum alloy, and copper alloy. Further, the heat dissipation substrate layer 10 of the present embodiment can be a porous substrate that can be immersed in an immersion-type coolant 900 (e.g., a single-phase coolant or a two-phase coolant), so that generation of vapor bubbles can be increased and an immersion-type heat dissipation effect can be enhanced. In addition, the heat dissipation substrate layer 10 of the present embodiment has a porosity between 5% and 15%. It should be noted that, porous structure is exaggeratedly enlarged in FIG. 1 for a better understanding of the present disclosure.

Figure 3:
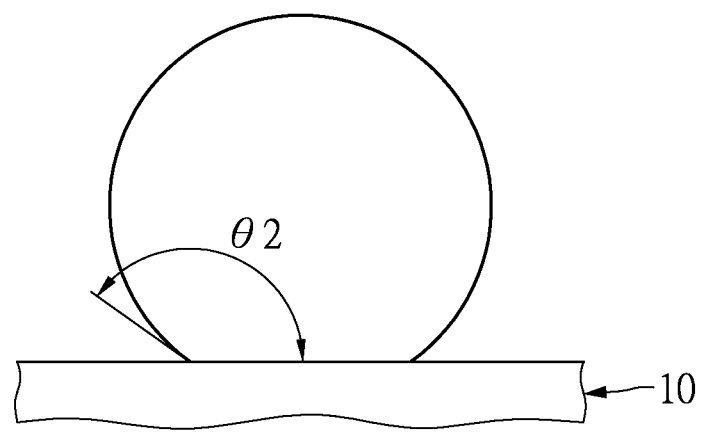
FIG. 3 is a schematic view of a contact angle between a heat dissipation substrate layer and the immersion-type coolant according to the present disclosure.
Figure 4:
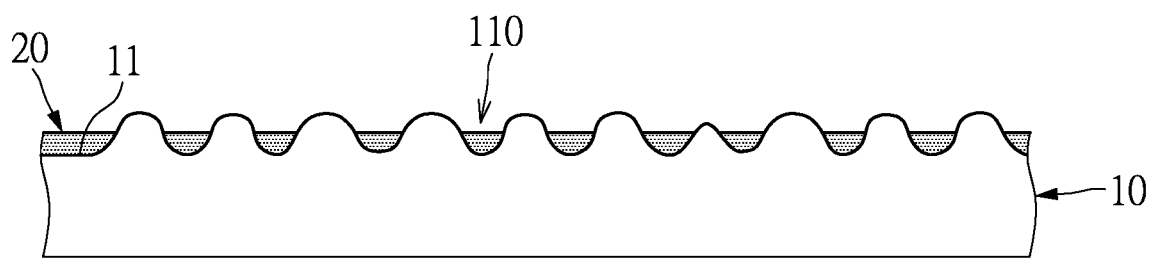
FIG. 4 is a schematic view showing the surface film layer which covers a surface of the heat dissipation substrate layer but does not fill into surface holes of the heat dissipation substrate layer according to the present disclosure.

In the present embodiment, the surface film layer 20 is formed on the heat dissipation substrate layer 10, and a contact angle θ1 between the surface film layer 20 and the immersion-type coolant 900 (as show in FIG. 2) is less than a contact angle θ2 between the heat dissipation substrate layer 10 and the immersion-type coolant 900 (as shown in FIG. 3), so that an affinity of the surface film layer 20 for the immersion-type coolant 900 is greater than an affinity of the heat dissipation substrate layer 10 for the immersion-type coolant 900. Therefore, an affinity of a surface of the immersion-type liquid cooling heat dissipation sink of the present embodiment for the immersion-type coolant 900 can be increased through the surface film layer 20, so that an escape rate of vapor bubbles can be increased to shorten a vapor bubble generation cycle, thereby increasing a rate of heat dissipation.

Further, a thickness of the surface film layer 20 needs to be maintained to be less than an effective thickness so as to effectively shorten the vapor bubble generation cycle to increase the rate of heat dissipation. Therefore, the thickness of the surface film layer 20 is less the effective thickness of 5 μm.

In addition, the surface film layer 20 of the present embodiment can be a metal film, which can be formed on the heat dissipation substrate layer 10 by sputtering or other ways. Moreover, the metal film covers a surface 11 of the heat dissipation substrate layer 10 but does not fill into each of surface holes 110 of the surface 10 of the heat dissipation substrate layer 10 (the surface holes 110 are exaggeratedly enlarged in FIG. 4).

Further, the metal film of the present embodiment can be made of zinc, titanium, tin, silver, stainless steel, or alloys thereof. In addition, the metal film layer of the present embodiment is preferably a zinc film or a titanium film. Moreover, an effective thickness of the zinc film or the titanium film of the present embodiment is preferably between 30 nm and 3300 nm according to experimental results. In particular, when the effective thickness of the zinc film or the titanium film of the present embodiment is 3300 nm, the zinc film or the titanium film can substantially cover the surface 11 of the heat dissipation substrate layer 10 but does not fill into each of surface holes 110 of the surface 10 of the heat dissipation substrate layer 10, so that a measured thermal resistance value of the immersion-type liquid cooling heat dissipation sink of the present embodiment can be minimized.

In addition, the surface film layer 20 of the present embodiment can also be a ceramic film, which can be formed on the heat dissipation substrate layer 10 by, for example, spraying or other ways. Moreover, the ceramic film covers the surface 11 of the heat dissipation substrate layer 10 but does not fill into the surface holes 110 of the surface 11 of the heat dissipation substrate layer 10. In addition, the ceramic film of the present embodiment can be made of aluminum oxide, silicon oxide, aluminum nitride, or silicon nitride.

Second Embodiment

Figure 5:
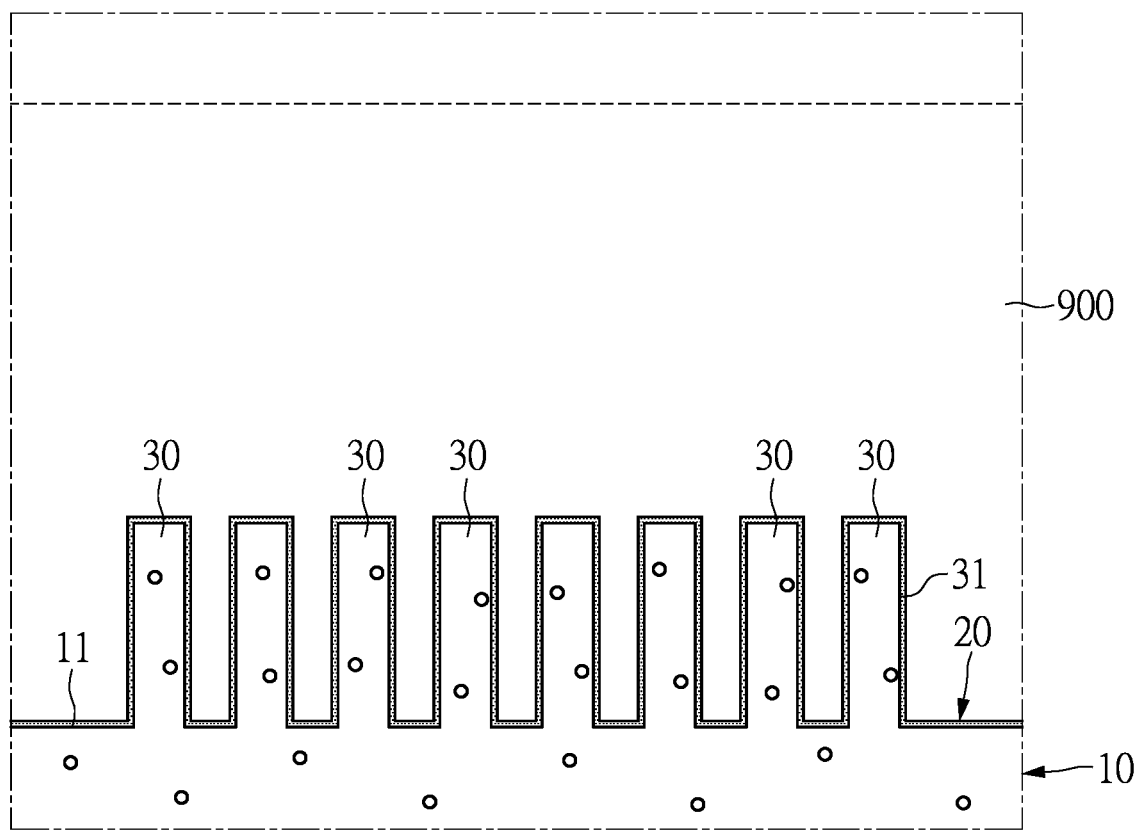
FIG. 5 is a schematic side view of an immersion-type liquid cooling heat dissipation sink according to a second embodiment of the present disclosure.
Figure 6:
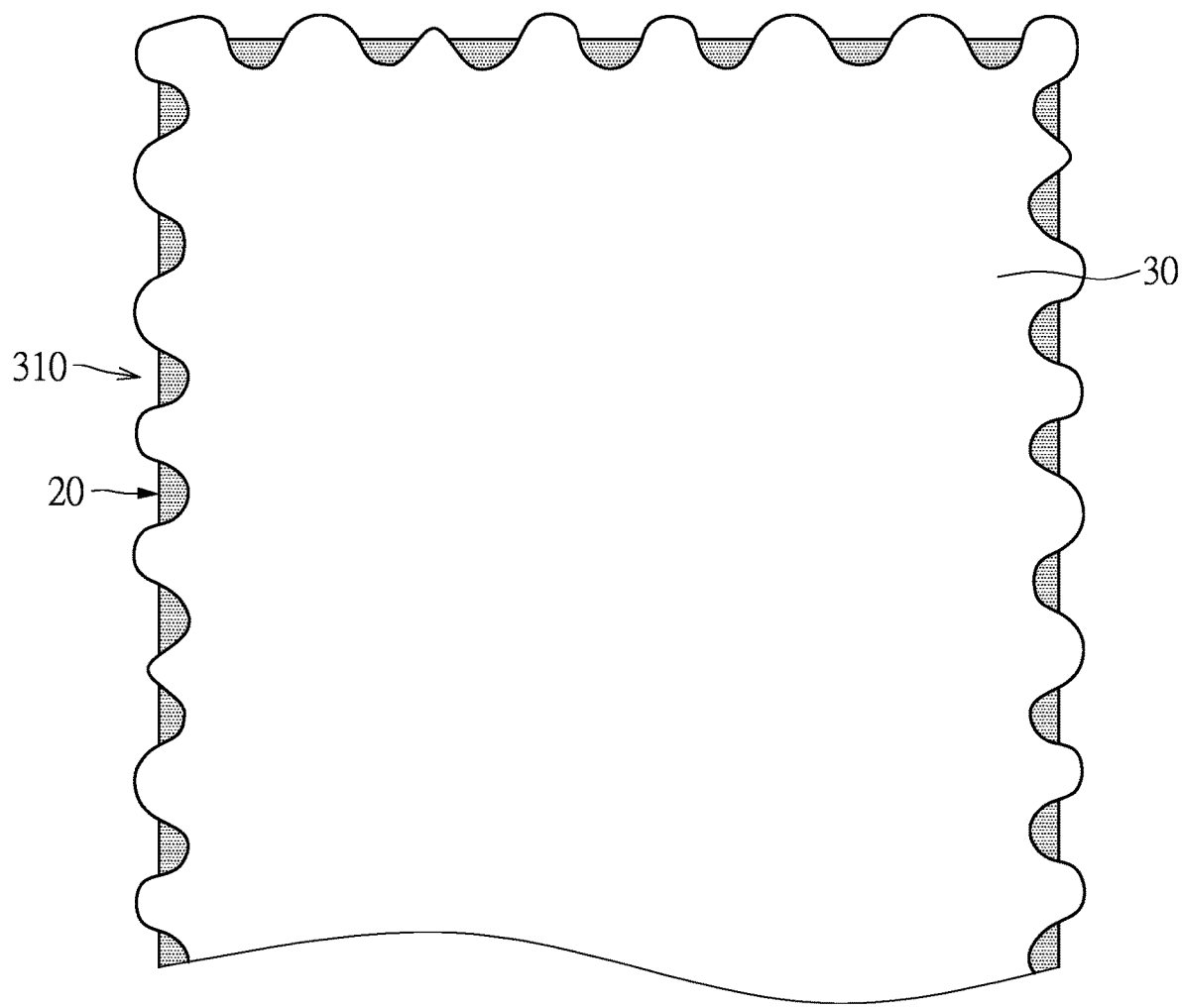
FIG. 6 is a schematic view showing the surface film layer which covers a surface of a fin but does not fill into surface holes of the fin according to the present disclosure.

Reference is made to FIG. 5 and FIG. 6, in which a second embodiment of the present disclosure is shown. The present embodiment is substantially the same as the first embodiment, and differences therebetween are described as follows.

In the present embodiment, a plurality of fins 30 are integrally formed on the surface 11 of the heat dissipation substrate layer 10. Each of the plurality of fins 30 of the present embodiment can be a pin fin, a plate fin, a composite fin structure formed by a combination of the pin fin and the plate fin, or a fin in other shapes.

In addition, each of the plurality of fins 30 is preferably and integrally formed on the surface 11 of the heat dissipation substrate layer 10 by metal injection molding. That is, the heat dissipation substrate layer 10 is a porous substrate that is integrally formed by metal injection molding, and each of the plurality of fins 30 is a porous fin that is integrally formed on the surface 11 of the heat dissipation substrate layer 10 by metal injection molding.

In addition, the surface film layer 20 covers the surface 11 of the heat dissipation substrate layer 10 and a surface 31 of each of the plurality of fins 30, but does not fill into each of the surface holes 110 of the surface 10 of the heat dissipation substrate layer 10 and each of surface holes 310 of the surface 31 of the each of the plurality of fins 30 (the surface holes 310 are exaggeratedly enlarged in FIG. 6). Furthermore, the surface film layer 20 can also completely cover the surface 31 of each of the plurality of fins 30.

Third Embodiment

Figure 7:
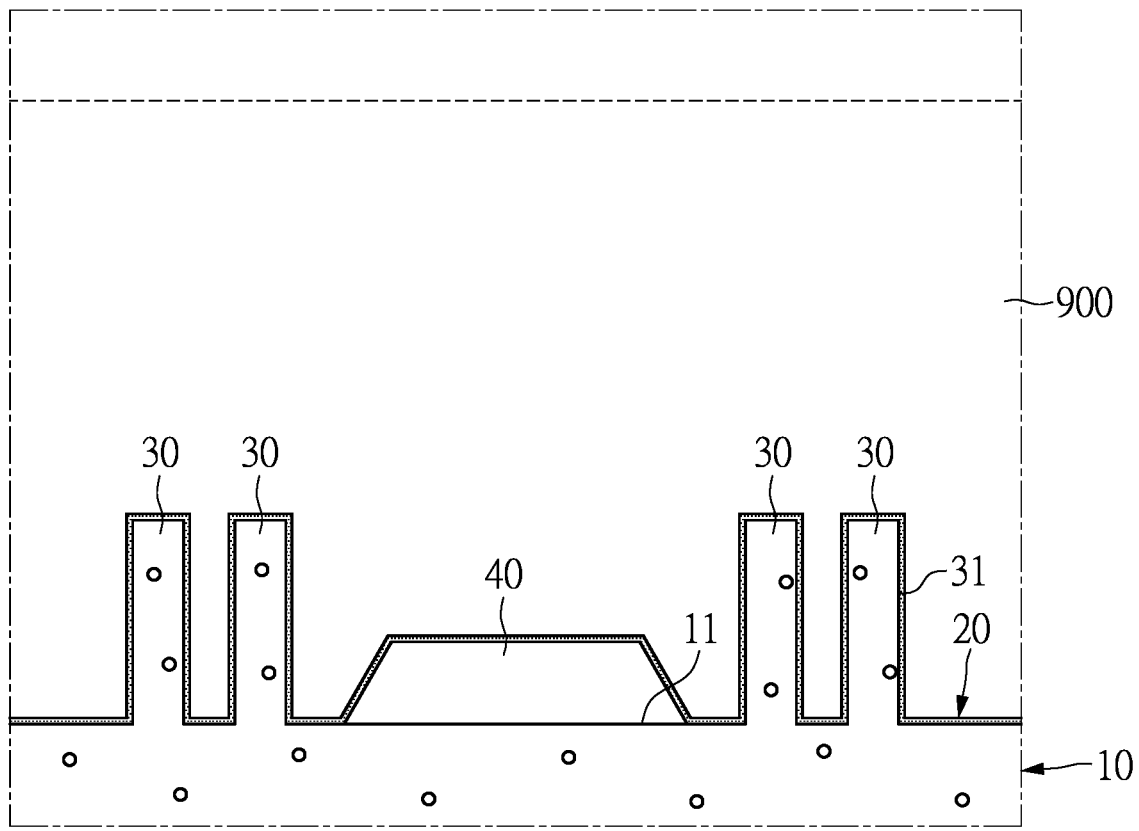
FIG. 7 is a schematic side view of an immersion-type liquid cooling heat dissipation sink according to a third embodiment of the present disclosure.

Reference is made to FIG. 7, in which a third embodiment of the present disclosure is shown. The present embodiment is substantially the same as the second embodiment, and differences therebetween are described as follows.

In the present embodiment, a reinforcement structure 40 is also formed on the surface 11 of the heat dissipation substrate layer 10 so as to reinforce a structural strength of the heat dissipation substrate layer 10. The reinforcement structure 40 of the present embodiment can be an integral reinforcement structure protruding from a center of the surface 11 of the heat dissipation substrate 10. That is, the reinforcement structure 40 can be integrally connected to the surface 11 of the heat dissipation substrate layer 10 by metal injection molding. The reinforcement structure 40 of the present embodiment can also be connected to the surface 11 of the immersion-type heat dissipation substrate 10 in a non-integral manner, that is, the reinforcement structure 40 can be a sintered structure formed on the surface 11 of the heat dissipation substrate layer 10 by sintering. In addition, the reinforcement structure 40 of the present embodiment can also be a deposition structure formed on the surface 11 of the heat dissipation substrate layer 10 by physical deposition or chemical deposition.

In addition, a number of the reinforcement structures 40 can be multiple, and a projection area of each of the reinforcement structures 40 on the surface 11 of the heat dissipation substrate layer 10 is at least two times larger than a projection area of each of the plurality of fins 30 on the surface 11 of the heat dissipation substrate layer 10.

Beneficial Effects of the Embodiments

In conclusion, in the immersion-type liquid cooling heat dissipation sink provided by the embodiments of the present disclosure, by virtue of the immersion-type liquid cooling heat dissipation sink including the heat dissipation substrate layer and the surface film layer that is formed on the heat dissipation substrate layer, the heat dissipation substrate layer being the porous substrate that is immersed in the immersion-type coolant, and the contact angle between the surface film layer and the immersion-type coolant being less than the contact angle between the heat dissipation substrate layer and the immersion-type coolant, and the thickness of the surface film layer being less than the effective thickness of 5 μm, the affinity of the surface film layer for the immersion-type coolant is greater than the affinity of the heat dissipation substrate layer for the immersion-type coolant. Therefore, the affinity of the surface of the immersion-type liquid cooling heat dissipation sink of the embodiments of the present disclosure for the immersion-type coolant can be increased through the surface film layer, so that the escape rate of vapor bubbles can be increased to shorten the vapor bubble generation cycle, thereby increasing the rate of heat dissipation. In addition, the thickness of the surface film layer is less than the effective thickness of 5 μm, so as to effectively shorten the vapor bubble generation cycle to increase the rate of heat dissipation. Therefore, an overall heat dissipation effect of the immersion-type liquid cooling heat dissipation sink can be increased.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An immersion liquid cooling heat dissipation sink, comprising:
    a heat dissipation substrate layer; and
    a surface film layer formed on the heat dissipation substrate layer;
    wherein the heat dissipation substrate layer is a porous substrate that is immersed in an immersion coolant, a contact angle between the surface film layer and the immersion coolant is less than a contact angle between the heat dissipation substrate layer and the immersion coolant, and a thickness of the surface film layer is less than an effective thickness of 5 μm;
    wherein the surface film layer is a ceramic film which covers a surface of the heat dissipation substrate layer but does not fill into each of surface holes of the surface of the heat dissipation substrate layer, and the ceramic film is made of aluminum oxide, silicon oxide, aluminum nitride, or silicon nitride.

2. The immersion liquid cooling heat dissipation sink according to claim 1, wherein the heat dissipation substrate layer is made of aluminum, copper, aluminum alloy, or copper alloy.

3. The immersion liquid cooling heat dissipation sink according to claim 1, wherein a plurality of fins are integrally formed on a surface of the heat dissipation substrate layer, and each of the plurality of fins is a pin fin, a plate fin, or a composite fin structure formed by a combination of the pin fin and the plate fin.

4. The immersion liquid cooling heat dissipation sink according to claim 3, wherein at least one reinforcement structure is further formed on the surface of the heat dissipation substrate layer, and a projection area of the at least one reinforcement structure on the surface of the heat dissipation substrate layer is at least two times larger than a projection area of any one of the plurality of fins on the surface of the heat dissipation substrate layer.

5. The immersion liquid cooling heat dissipation sink according to claim 1, wherein the heat dissipation substrate layer has a porosity between 5% and 15%.

6. An immersion liquid cooling heat dissipation sink, comprising:
    a heat dissipation substrate layer; and
    a surface film layer formed on the heat dissipation substrate layer;
    wherein the heat dissipation substrate layer is a porous substrate that is integrally formed by metal injection molding and immersed in an immersion coolant, a contact angle between the surface film layer and the immersion coolant is less than a contact angle between the heat dissipation substrate layer and the immersion coolant, and a thickness of the surface film layer is less than an effective thickness of 5 μm;
    wherein the surface film layer is a ceramic film which covers a surface of the heat dissipation substrate layer but does not fill into each of surface holes of the surface of the heat dissipation substrate layer, and the ceramic film is made of aluminum oxide, silicon oxide, aluminum nitride, or silicon nitride.

7. The immersion liquid cooling heat dissipation sink according to claim 6, wherein the heat dissipation substrate layer is made of aluminum, copper, aluminum alloy, or copper alloy.

8. The immersion liquid cooling heat dissipation sink according to claim 6, wherein a plurality of fins are integrally formed on a surface of the heat dissipation substrate layer, and each of the plurality of fins is a pin fin, a plate fin, or a composite fin structure formed by a combination of the pin fin and the plate fin.

9. The immersion liquid cooling heat dissipation sink according to claim 8, wherein at least one reinforcement structure is further formed on the surface of the heat dissipation substrate layer, and a projection area of the at least one reinforcement structure on the surface of the heat dissipation substrate layer is at least two times larger than a projection area of any one of the plurality of fins on the surface of the heat dissipation substrate layer.

10. The immersion liquid cooling heat dissipation sink according to claim 6, wherein the heat dissipation substrate layer has a porosity between 5% and 15%.

* * * * *